United States Patent [19]

Biber

[11] 4,339,514
[45] Jul. 13, 1982

[54] PROCESS FOR MAKING SOLID-STATE COLOR IMAGING DEVICE

[75] Inventor: Conrad H. Biber, Needham, Mass.

[73] Assignee: Polaroid Corporation, Cambridge, Mass.

[21] Appl. No.: 202,945

[22] Filed: Nov. 3, 1980

[51] Int. Cl.³ .............................................. G03F 7/02
[52] U.S. Cl. ...................................... 430/7; 430/312; 430/319; 430/320; 430/321
[58] Field of Search .................. 430/7, 312, 319, 320, 430/321; 313/371, 367

[56] References Cited

U.S. PATENT DOCUMENTS

| | | | |
|---|---|---|---|
| 2,908,835 | 10/1959 | Weimer | 313/65 |
| 3,284,208 | 4/1963 | Land | 430/7 |
| 3,734,737 | 5/1973 | Sharp | 96/80 |
| 3,891,440 | 6/1975 | Gallaro et al. | 313/472 |
| 4,029,394 | 6/1977 | Araki | 350/166 |
| 4,081,277 | 3/1978 | Brault et al. | 430/320 |
| 4,086,089 | 4/1978 | Seward et al. | 96/27 R |
| 4,168,448 | 9/1979 | Brault et al. | 313/371 |
| 4,196,010 | 4/1980 | Sandhu | 430/7 |
| 4,204,866 | 5/1980 | Horak et al. | 430/320 |
| 4,271,246 | 6/1981 | Sato | 430/7 |

Primary Examiner—Mary F. Downey
Attorney, Agent, or Firm—David R. Thornton

[57] ABSTRACT

Processes for making an electronic color imaging device, the color imaging device comprising a planar array of charge-handling semiconductive photosensors and a multicolor filter means, the multicolor filter means comprising a planar array of color filter elements superimposed in micro-registration over the sensing area of said photosensors. In general, the processes comprise the steps of: (1) successively coating on a planar array of semiconductive photosensors a plurality of photoresponsive layers; (2) subjecting each photoresponsive layer in succession to radiation whereby to provide an exposed area of said layer; (3) removing unexposed photoresponsive coating from each layer in succession; and, (4) dyeing exposed areas of each layer said coating in succession to obtain a series of chromatic filter elements. The processes are capable of producing color filter elements having dimensions of approximately 6 by 6 micrometers.

10 Claims, 5 Drawing Figures

FIG. 1.
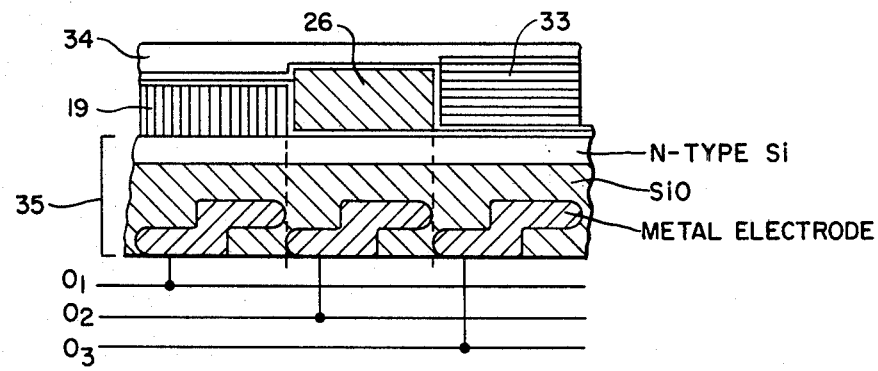
FIG. 3.
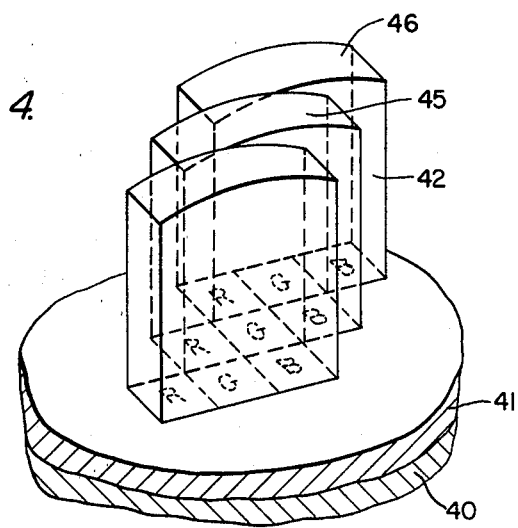
FIG. 4.

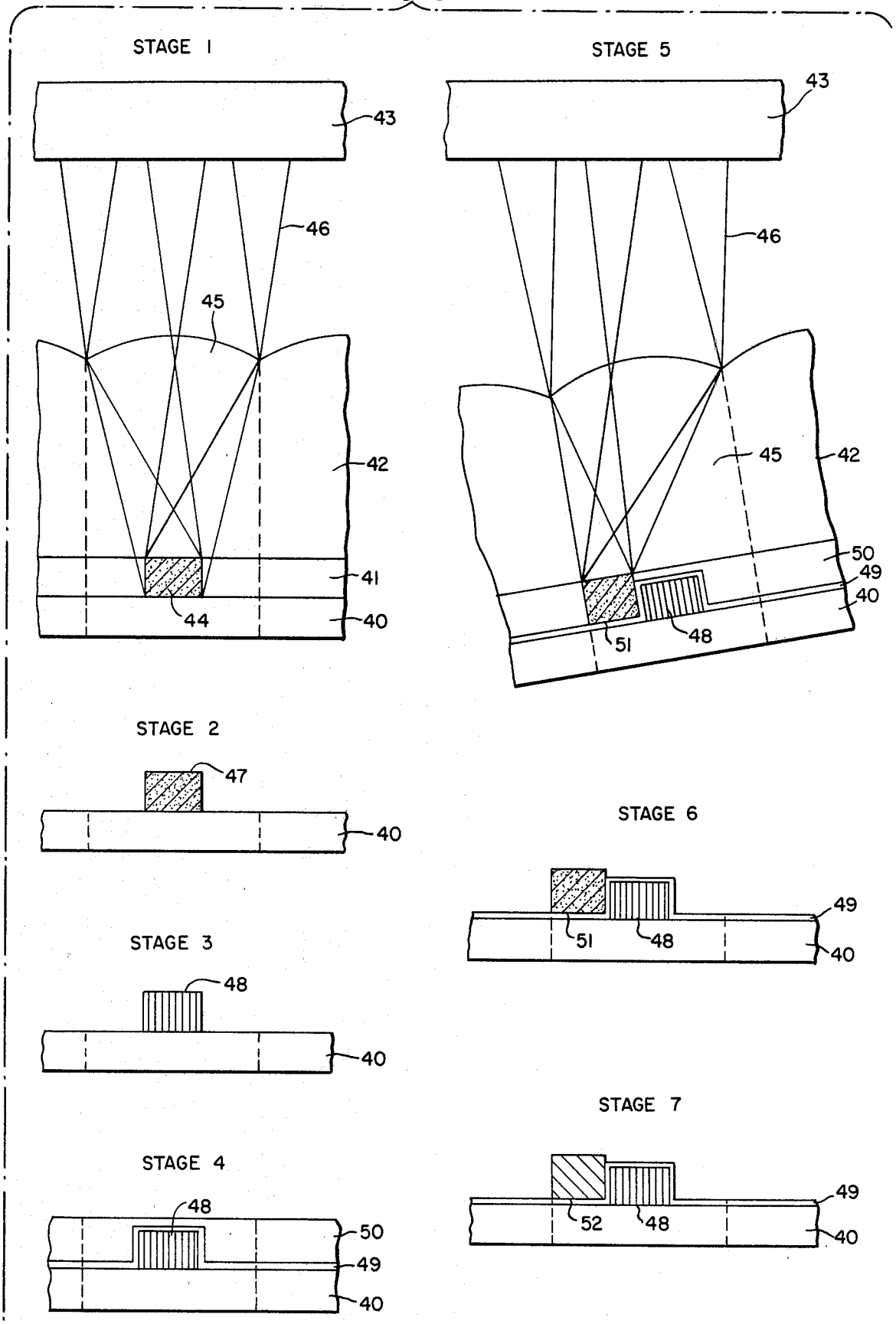

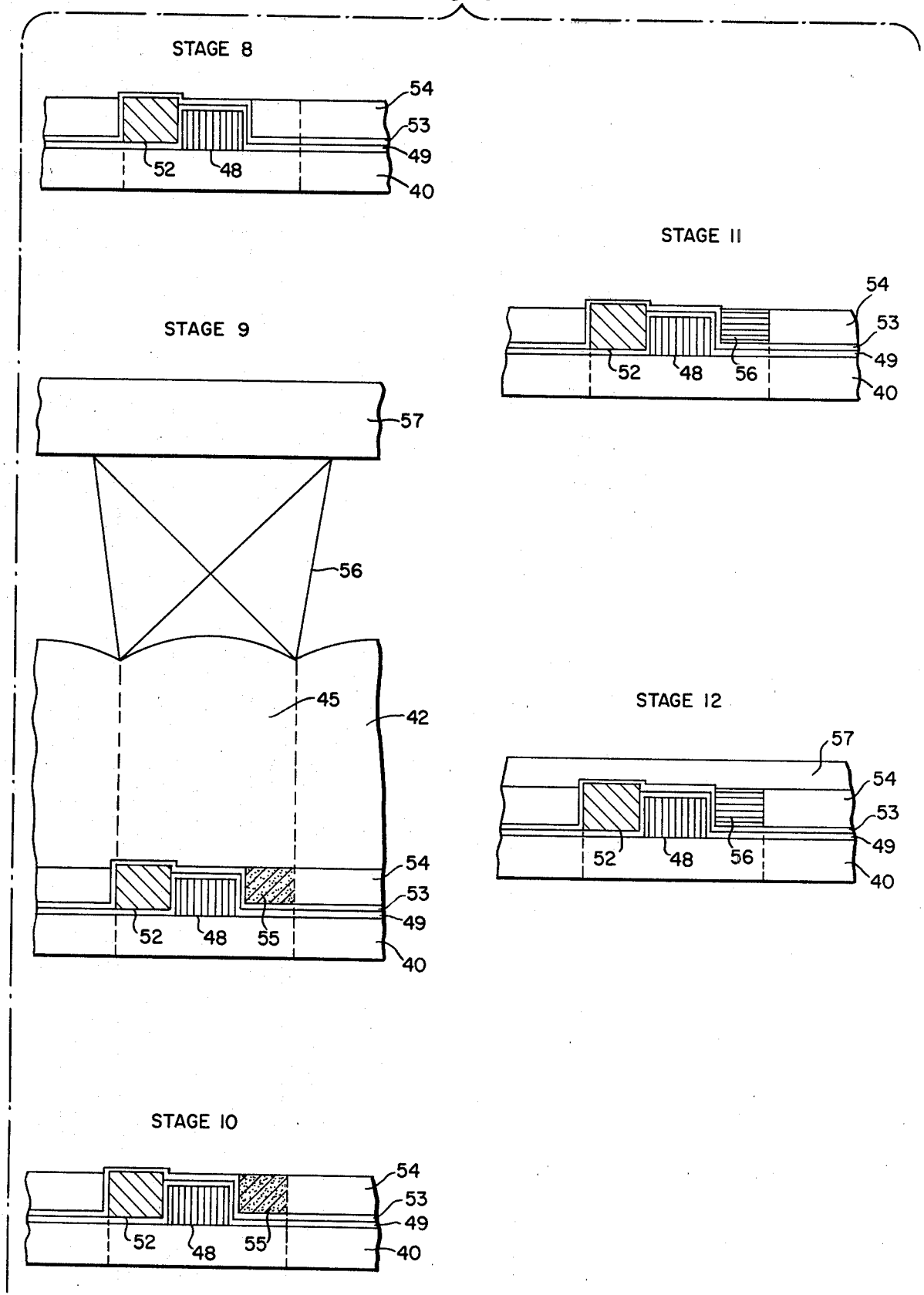

PROCESS FOR MAKING SOLID-STATE COLOR IMAGING DEVICE

BACKGROUND OF THE INVENTION

1. Field of the Invention

The invention relates to processes for making electronic color imaging devices, particularly to a solid-state photosensitive device that has a planar array of charge-handling semiconductive photosensors in micro-registration with a multicolor planar array of filter elements. The color imaging devices are particularly useful, for example, as solid-state video cameras.

2. Description of the Prior Art

Color photosensitive devices using charge-handling solid-state image sensors of various types, for example, charge-coupling devices, known as CCDs, and charge-coupling imagers known as CCIs, have been used in video cameras. Tompsett et al., Electronics, vol. 46, pp. 162-169 (Jan. 18, 1973). To avoid optical complexity and problems with image registration, it is highly desirable that color image sensing occur at a single imaging site, e.g., at a single planar photosensitive array.

As recognized in U.S. Pat. No. 4,081,277 and divisional U.S. Pat. No. 4,168,448, both to Brault et al., it is desirable for each element in the filter array to be as close as possible to the surface of the underlying photosensor element or elements in the array. This result is accomplished in Brault et al. by producing a relatively thin, single layer multicolor filter array superimposed on the surface of the image sensor. A single layer multicolor filter array substantially reduces the possibility that light rays which pass through a filter element at an angle to the optical axis will strike a photosensor element beneath an adjacent filter element. In the preferred embodiment of Brault et al, each color filter element is rectangular in shape and has dimensions of 30 by 40 micrometers.

Brault et al. disclose a photoresist method for making a color imaging device using a transparent, polyester dye-receiving layer for receiving heat-transferable dyes. The heat-transferable dye is diffused into the polyester layer at an elevated temperature through window areas in a photoresist layer.

U.S. Pat. No. 3,284,208 to Edwin H. Land discloses a process for preparing photographic multicolor screen elements exhibiting a high degree of optical acuity and particularly adapted for use in additive multicolor photographic processes, both conventional and diffusion transfer types, by successively coating on the smooth or flat surface of a lenticular film a plurality of photoresponsive layers. Each photoresponsive layer is subjected to exposure radiation incident on the lenticular film at angles adapted to provide exposed areas of the coating contiguous each lenticule. The unexposed areas of the coating are then removed and the exposed areas dyed to provide a series of chromatic filter elements. The incident radiation employed to effect exposure of successive photoresponsive layers is directed so as to provide formation of each series of chromatic filter element in substantial side-by-side or screen relationship on the smooth surface of the lenticular film.

The technical article by Edwin H. Land entitled "An Introduction to Polavision" published in *Photographic Science and Engineering*, vol. 21, pages 225-236 (1977), and U.S. Pat. No. 3,734,737 to John R. Sharp describe and illustrate how the process of the above Land patent can be used to produce microscopically fine, regular multicolor stripes with great precision by the following steps: (1) embossing a film base to form fine lenticules; (2) exposing a light-sensitive layer of dichromated gelatin on the opposite side of the base through the lenticules to form line images; (3) washing away the unexposed gelatin; and, (4) dying the lines that remain. The process is repeated to complete an ultrafine array of alternating color stripes in the pattern red, green, blue, red, green, blue, and so forth. After the lenticules have been used to form lines, they are removed.

SUMMARY OF THE INVENTION

The present invention provides processes for making a color imaging device having an integral planar array of very small color filter elements superimposed on an array of solid-state photosensors. The processes of the present invention are capable of producing color filter elements having dimensions of approximately 6 by 6 micrometers.

In general, the processes comprise the steps of: (1) successively coating on a planar array of semiconductive photosensors a plurality of photoresponsive layers; (2) subjecting each photoresponsive layer to radiation whereby to provide an exposed area of said layer; (3) removing unexposed photoresponsive coating; and, (4) dyeing exposed areas of said coating to obtain a series of chromatic filter elements prior to deposition of successive photoresponsive layers.

BRIEF DESCRIPTION OF THE DRAWINGS

FIG. 1 is a schematic drawing of a planar multicolor planar filter array made in accord with the invention.

FIG. 3 is a partial cross-sectional view of a row of sensing elements of a color imaging device having a multicolor planar filter array made in accord with the invention.

FIG. 4 is a perspective view in partial cross-section illustrating the lenticular film layer consisting of offset rows of lenticules employed in the second preferred process of the invention.

FIG. 5 is a diagrammatic cross-sectional view illustrating the second preferred process of the invention which comprises the process stages set forth and which is further described hereinafter.

DESCRIPTION OF THE PREFERRED EMBODIMENTS

Figure 2:
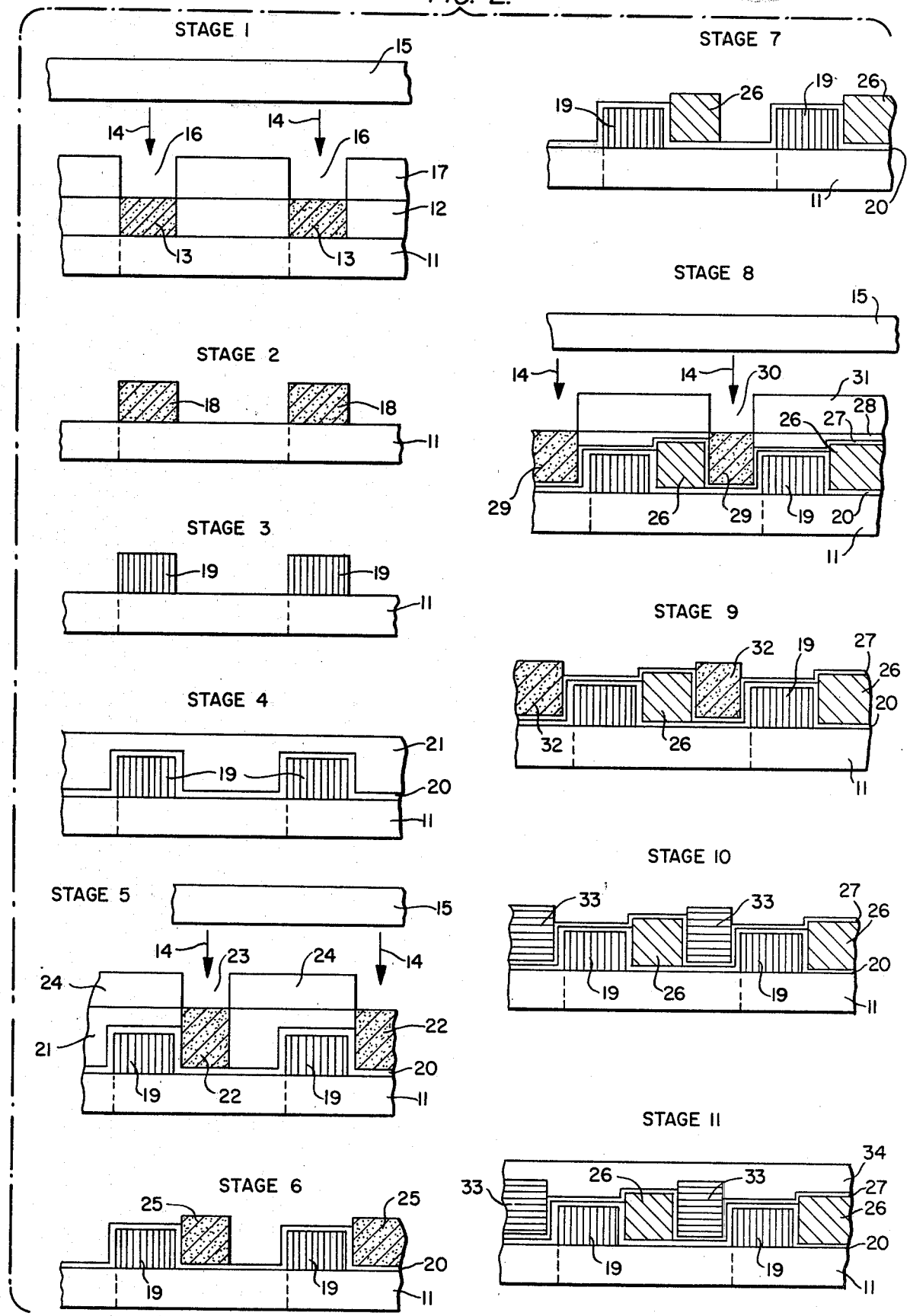
FIG. 2 is a diagrammatic cross-sectional view illustrating the first preferred process of the invention which comprises the process stages set forth and which is further described hereinafter.

In accordance with the present invention, methods are provided for making a color imaging device having an integral planar array of very small color filter elements superimposed on an array of solid-state photosensors. The solid-state photosensors used in the processes of this invention are charge-handling image sensors, examples of which include, for instance, charge-coupled devices (also known as charge-coupled imagers, charge-transfer devices, charge-transfer imagers, etc.), charge injection devices, bucket brigade devices, diode arrays, combinations of these, and the like.

The color filter elements are in micro-registration with the radiation sensing area of the underlying photosensor or photosensors. As used herein, the term "micro-registration" denotes that the color filter elements and the underlying sensing areas are aligned so that, on a micrometer scale, the filter element and the underlying sensing area are substantially coextensive with each other and the boundaries of such areas are substantially superimposed.

The color filter means consists of triplets or sets of three dyed filter elements, in each set like elements having common light absorption and transmission characteristics made by applying a dye to a transparent dye-absorbing layer. Advantageously, the individual filter elements in each set of light intercepting means contain a dye having radiation absorption and transmission in a different region of the spectrum from the other two elements in the set.

The very small color filter elements made by the present invention have extremely sharp edges. Therefore, the dyes in two adjacent filter elements have no overlap. This allows maximum transmission of light having the desired wavelength to the sensing area of the photosensor lying in micro-registration beneath the color filter element.

The importance of edge sharpness for the filter elements and the ability to make arrays of filter elements with the respective dyed areas being confined to desired dimensions is readily apparent when one considers the very small size of the sensing areas of the photosensors in a useful color imaging device and thus the correspondingly small size of the superimposed color filter elements. Useful color imaging devices made by this invention consist of an array of individual color filter elements each having dimensions of approximately 30 by 30 micrometers superimposed over an array of photosensors each having a corresponding sensing area with dimensions of approximately 30 by 30 micrometers. The invention is capable of producing color filter elements with dimensions of approximately 6 by 6 micrometers.

Thus, important advantages achieved by this invention are the potential for greatly reduced size of the individual color filter elements, the sharp edge definition of the individual color filter elements and the micro-registration of each filter element with the underlying photosensor.

As stated before, the color imaging devices are formed by superimposing the color filter means on the sensing means so that the individual color filter elements are in micro-registration with the underlying individual photosensors of the sensing means.

An example of a three-color filter array 10 having a planar array of color filter elements arranged in sequential triplets made in accord with the invention is illustrated in FIG. 1 (wherein R represents red, G represents green, and B represents blue). The sequential triplets of filter elements form an interlaid pattern to provide the three-color filter array. Each color filter element has a common light absorption and transmission characteristic which is different from each other color. In a color imaging device made by the invention, the filter array 10 is superimposed on an array of photosensors so that each individual filter element is in micro-registration with an individual photosensor. As a result of this arrangement, an image can be sampled for all three color vectors by selecting appropriate dyes to make the three sets of color filter elements of the filter array 10.

The filter array 10 consists of a transparent photoresponsive polymeric layer which has been exposed to electromagnetic radiation actinic to the layer and then treated with dyes to form the individual color filter elements. The photoresponsive polymeric layer is, for example, photohardenable gelatin sensitized with potassium, sodium or ammonium dichromate or photosensitized albumin, casein, gum arabic, polyvinyl alcohol or any other radiation-sensitive polymer. The photoresponsive layer is, preferably, approximately 4 micrometers thick when dry.

Referring to FIG. 2, there is shown, in stages, the first preferred process for the production of a solid-state color imaging device in accordance with the present invention. As specifically illustrated in stage 1, a semiconductive photosensor substrate 11 is coated with a transparent selectively photoresponsive polymeric layer 12, such as the stated dichromated gelatin, which is exposed at portions 13 to radiation 14, preferably ultraviolet radiation, from an exposure source 15 through windows 16 in photomask 17 which is in micro-registration with the substrate 11. Photomask 17 may be, for example, a piece of glass with a chrome layer mask. Using the dichromated gelatin, approximately 0.5 joule/sq. in. is adequate to harden the selected exposed portions 13 of such material.

The open area of each window 16 and consequently the area of each exposed portion 13 have dimensions, for example, of approximately 30 by 30 micrometers.

Subsequent to photoexposure, in stage 2, the photomask 17 is removed and the photoresponsive layer 12 is contacted with water or other suitable solvent for the unexposed photoresponsive layer, preferably within the range of 80° to 140° F., for a time interval of about 3 to 60 seconds, to remove the unexposed portions of photoresponsive layer 12 in accordance with the selected exposure pattern, and to leave standing exposed portions 18.

In stage 3, the exposed portions 18 are contacted with a dye solution, containing a dye substantive to the hardened dichromated gelatin, generally a primary red color acid dye (such as described in U.S. Pat. No. 3,284,208 to Edwin H. Land which is incorporated by reference herein), in order to impart the desired coloration thereto and, as a result, to form optical filter elements 19. In addition to the dye, the dye solution may contain suitable wetting agents and dispersing agents, etc. Subsequent to forming optical filter elements 19, the workpiece may be contacted with cold water or other suitable solvent to remove any residual or excess dye.

In stage 4, the workpiece is dried and the first optical filter elements 19 and the remaining semiconductive photosensor substrate 11 are coated with an adhesive lacquer layer 20. Subsequent to the drying of lacquer coating 20, a second photoresponsive layer 21, such as the stated dichromated gelatin, is then overcoated on adhesive layer 20.

In stage 5, the photoresponsive layer 21 is exposed at portions 22 to radiation 14, preferably ultraviolet radiation, from an exposure source 15 through windows 23 in a second photomask 24 which is in micro-registration with the semiconductive photosensor substrate 11.

The open area of each window 23 and consequently the area of each exposed portion 22 have dimensions of approximately 30 by 30 micrometers.

Subsequent to photoexposure, in stage 6, photomask 24 is removed and the photoresponsive layer 21 is contacted with water or other suitable solvent for the unexposed photoresponsive layer, to remove the unexposed portions of photoresponsive layer 21, in accordance with the selected exposure pattern, and to leave standing exposed portions 25.

The workpiece is, in stage 7, contacted with a second dye solution containing a dye substantive to the hardened dichromated gelatin, generally an acid dye of green coloration (such as described in U.S. Pat. No. 3,284,208), to provide second optical filter elements 26.

In stage 8, the workpiece, now containing a first and second series of optical color filter elements, has the external surface thereof coated with a third adhesive lacquer layer 27 which, subsequent to drying, is overcoated with a third photoresponsive layer 28 which is exposed at portions 29 to radiation 14 from an exposure source 15 through windows 30 in a third photomask 31 which is in micro-registration with the semiconductive substrate 11.

The open area of each window 30 and consequently the area of each exposed portion 29 have dimensions of approximately 30 by 30 micrometers.

Subsequent to photoexposure, the workpiece is contacted with water in stage 9, as previously described, whereby to effect removal of unexposed photoresponsive layer, in accordance with the exposure pattern, and to leave standing exposed portions 32.

In stage 10, the workpiece is contacted with a dye solution containing a dye substantive to the hardened dichromated gelatin, generally an acid dye of blue coloration (such as described in U.S. Pat. No. 3,284,208), to provide third optical filter elements 33.

Optionally, the multicolor filter array may be overcoated with a transparent protective polymeric composition 34, illustrated in stage 11, such as nitrocellulose, cellulose acetate, etc.

As illustrated by FIG. 3, a color imaging device made by the foregoing process has a solid-state imaging array 35 consisting of individual charge-coupled photosensors (e.g., the individual photosensor extending between the dashed lines of FIG. 3). The multicolor filter array, consisting of individual red filter elements 19, green filter elements 26 and blue filter elements 33, is superimposed over the imaging array 35. The individual filter elements 19, 26, and 33 are aligned in one-to-one micro-registration with the individual photosensors of the imaging array 35 to form individual color imaging elements.

Individual filter elements of the filter array are of the selectively transmitting type and are arranged in patterns as described above with reference to FIG. 1. Thus, the color imaging device consists of an array of color imaging elements, each consisting of an individual color filter element combined with an individual photosensor, the combination being selectively sensitive to a particular region of the spectrum.

A second preferred process of the invention may be employed to make the three-color filter array 10 illustrated in FIG. 1. Referring to FIG. 4, the second preferred process uses a separate transparent polymeric lenticular film layer 42 having individual lenticules 45 and 46 which are arranged in rows. Each row of lenticules is offset from the preceding row by a distance equal to one-third the length of a lenticule.

For example, one lenticule may be 90 micrometers in length and 30 micrometers in width. The lenticules in the next adjacent row are offset from the lenticules in the preceding row by one-third the length of one lenticule or 30 micrometers. The process is capable of using lenticules which are approximately 18 micrometers in length and 6 micrometers in width, thereby producing color filter elements which have dimensions of approximately 6 by 6 micrometers.

The fine lenticules in lenticular film layer 42 are formed in the surface of the film layer by contacting the film with a rotating embossing roller under appropriate conditions of temperature, pressure and/or solvents to provide lenticules of the shape and size desired.

Lenticular layer 42 is micro-registered over a photoresponsive polymeric layer 41 which is coated on a semiconductive photosensor substrate 40. The photoresponsive polymeric layer is, for example, photohardenable gelatin sensitized with potassium, sodium or ammonium dichromate or photosensitized albumin, casein, gum arabic, polyvinyl alcohol or any other radiation-sensitive polymer. The photoresponsive layer is, preferably, approximately 4 micrometers thick when dry.

FIG. 5 shows the stages in the second preferred process. As illustrated in stage 1, semiconductive photosensor substrate 40 is coated with transparent selectively photoresponsive polymeric layer 41, such as the above-described dichromated gelatin, which is exposed to radiation 46, preferably ultraviolet radiation, from exposure source 43.

The lines of radiation 46 are directed so as to impinge on lenticule 45, of lenticular film layer 42, whereby the radiation traversing each lenticule is focused in an area 44 of photoresponsive layer 41 immediately contiguous each lenticule 45. The area of exposure 44 comprises approximately one-third of the photoresponsive area immediately contiguous each lenticule 45 and, as a result thereof, approximately one-third of the photoresponsive area 41 immediately continguous each lenticule 45 is subjected to exposure radiation. For example, exposed area 44 may have dimensions of approximately 30 by 30 micrometers.

Subsequent to photoexposure, in stage 2, the lenticular film layer 42 is removed and the photoresponsive layer 41 is contacted with water or other suitable solvent for the unexposed photoresponsive layer, preferably within the range of 80° to 140° F., for a time interval of about 3 to 60 seconds, to remove the unexposed portions of photoresponsive layer 41 in accordance with the selected exposure pattern, and to leave standing exposed portions 47.

In stage 3, the exposed portions 47 are contacted with a dye solution, containing a dye substantive to the hardened dichromated gelatin, generally a primary red color acid dye (such as described in U.S. Pat. No. 3,284,208 to Edwin H. Land which is incorporated by reference herein), in order to impart the desired coloration thereto and, as a result, to form optical filter elements 48. In addition to the dye, the dye solution may contain suitable wetting agents and dispersing agents, etc. Subsequent to forming optical filter elements 48, the workpiece may be contacted with cold water or other suitable solvent to remove any residual or excess dye.

In stage 4, the workpiece is dried and the first optical filter elements 48 and the remaining semiconductive photosensor substrate 40 are coated with an adhesive lacquer layer 49. Subsequent to the drying of lacquer layer 49, a second photoresponsive layer 50, such as the stated dichromated gelatin, is then overcoated on adhesive layer 49.

In stage 5, lenticular film layer 42 is again superimposed over photoresponsive layer 50 so as to be in micro-registration with photosensor substrate 40. Photoresponsive layer 50 is then exposed to radiation 46 from exposure source 43, the lines of radiation 46 being directed so as to impinge on lenticule 45, of lenticular film layer 42, at such angles as to provide radiation traversing each lenticule 45 and focusing in area 51 of photoresponsive layer 50, contiguous each lenticule 45. Area 51 is preferably equal to one-third of the surface area of the respective lenticule 45 immediately adjacent photoresponsive layer 50 and, as a result thereof, provides an exposed area 51 approximately equal in dimensions to that of preceding optical filter element 48, for example, approximately 30 by 30 micrometers.

Subsequent to photoexposure, in stage 6, lenticular film layer 42 is removed and photoresponsive layer 50 is contacted with water or other suitable solvent for the unexposed photoresponsive layer, to remove the unexposed portions of photoresponsive layer 50 in accordance with the selected exposure pattern, and to leave standing exposed portions 51.

The workpiece is, in stage 7, contacted with a second dye solution containing a dye substantive to the hardened dichromated gelatin, generally acid dye of green coloration (as described in U.S. Pat. No. 3,284,208), to provide second optical filter elements 52.

In stage 8, the workpiece, now containing a first and second series of optical filter elements, has the external surface thereof coated with a third adhesive lacquer layer 53 which, subsequent to drying, is overcoated with a third photoresponsive layer 54.

The workpiece is then exposed, in stage 9, to diffuse radiation 56, derived from exposure source 57, whereby to effect impingement of diffuse radiation on the surface of lenticule 45 so as expose area 55 of photoresponsive layer 54, contiguous lenticule 45, which is not occupied by first and second optical filter elements 48 and 52, respectively.

Subsequent to photoexposure, lenticular film layer 42 is removed and the workpiece is contacted with water in stage 10, as previously described, whereby to remove the unexposed portions of photoresponsive layer 54 in accordance with the selected exposure pattern, and to leave standing exposed portions 55.

In stage 11, the workpiece is contacted with a dye solution containing a dye substantive to hardened dichromated gelatin 55, generally an acid dye of blue coloration (as described in U.S. Pat. No. 3,284,208), to provide third optical filter elements 56.

Optionally, the multicolor filter array may be overcoated with a transparent protective polymeric composition 57, illustrated in stage 12, such as nitrocellulose, cellulose acetate, etc.

The color imaging device, as made by the foregoing process, is illustrated in FIG. 3, described above.

The above-described embodiments are intended to be illustrative, not restrictive. The full scope of the invention is defined by the claims, and any and all equivalents are intended to be embraced.

I claim:

1. In a process for making a color imaging device, said color imaging device comprising an array of charge-handling semiconductive photosensors with an array of color filter elements superimposed in microregistration with the sensing area of said photosensors, the process comprising the steps of:
    (1) successively coating on an array of semiconductive photosensors a plurality of photoresponsive layers;
    (2) subjecting each photoresponsive layer in succession to active radiation whereby to provide an exposed area of that particular layer;
    (3) removing unexposed photoresponsive coating of each layer in succession; and
    (4) dyeing exposed areas of each layer of said coating in succession to obtain a series of chromatic filter elements.

2. In a process for making a color imaging device, said color imaging device comprising an array of charge-handling semiconductive photosensors with an array of color filter elements superimposed in microregistration with the sensing area of said photosensors, the process comprising the steps of:
    (1) applying a first coating of photoresponsive material on said array of semiconductive photosensors, said photoresponsive material being adapted to be hardened as a result of photoexposure to radiation incident on said material;
    (2) exposing said first photoresponsive coating to active radiation incident in a pattern representing a first set of filter elements to provide selectively exposed areas of said first coating;
    (3) removing unexposed photoresponsive coating;
    (4) dyeing the remaining areas of said first coating with a first color to obtain a first series of chromatic filter elements;
    (5) applying a second coating of photoresponsive material on said array of semiconductive photosensors;
    (6) exposing said second photoresponsive coating to active radiation incident in a pattern representing a second set of filter elements to provide selectively exposed areas of said second coating;
    (7) removing unexposed photoresponsive coating;
    (8) dyeing the remaining areas of said second coating with a second color to obtain a second series of chromatic filter elements;
    (9) applying a third coating of photoresponsive material on said array of semiconductive photosensors;
    (10) exposing said third photoresponsive coating to active radiation incident in a pattern representing a third set of filter elements to provide selectively exposed areas of said third coating;
    (11) removing unexposed photoresponsive coating; and,
    (12) dyeing the remaining areas of said third coating with a third color to obtain a third series of chromatic filter elements.

3. A process as defined in claim 2, including the step of coating a protective polymeric layer on the external surface of said optical filter elements.

4. A process as defined in claim 2, wherein one of said colors comprises red, one of said colors comprises green, and one of said colors comprises blue.

5. A process as defined in claim 2, wherein at least one of said photoresponsive coatings comprises a polymer selected from the group consisting of potassium, sodium and ammonium dichromate sensitized gelatin.

6. A process as defined in claim 2, wherein an adhesive laquer is interposed between each of said photoresponsive coatings and the immediately preceding coating.

7. The process of claim 2 wherein said exposing steps comprise exposing the successive photosensitive coatings through different photomasks representing said first, second and third sets of said filter elements respectively.

8. The process of claim 2 wherein said exposing steps comprise exposing the successive photosensitive coatings at different angles through a lenticular array to respectively provide exposed areas representing said first, second and third sets of filter elements.

9. A color imaging device, an array of charge-handling semiconductive photosensors having an array of color filter elements superimposed in micro-registration with the sensing area of said photosensors, constructed by the steps of:
   (1) applying a first coating of photoresponsive material on said array of semiconductive photosensors, said photoresponsive material being adapted to be hardened as a result of selective photoexposure to radiation incident on said material;
   (2) exposing said first photoresponsive coating to active radiation in a pattern representing a first set of filter elements to provide selectively exposed areas of said first coating;
   (3) removing unexposed photoresponsive coating; p1
   (4) dyeing the remaining areas of said first coating with a first color to obtain a first series of chromatic filter elements;
   (5) applying a second coating of photoresponsive material on said array of semiconductive photosensors;
   (6) exposing said second photoresponsive coating to active radiation in a pattern representing a second set of filter elements to provide selectively exposed areas of said second coating;
   (7) removing unexposed photoresponsive coating;
   (8) dyeing the remaining areas of said second coating with a second color to obtain a second series of chromatic filter elements;
   (9) applying a third coating of photoresponsive material on said array of semiconductive photosensors;
   (10) exposing said third photoresponsive coating to active radiation in a pattern representing a third set of filter elements to provide selectively exposed areas of said third coating;
   (11) removing unexposed photoresponsive coating; and,
   (12) dyeing the remaining areas of said third coating with a third color to obtain a third series of chromatic filter elements an adhesive layer between each of said photoresponsive coatings.

10. The product as defined in claim 9, including the step of coating a protective polymeric layer on the external surface of said optical filter elements.

* * * * *